United States Patent
Li

(10) Patent No.: US 10,083,919 B2
(45) Date of Patent: Sep. 25, 2018

(54) PACKAGING FOR HIGH SPEED CHIP TO CHIP COMMUNICATION

(71) Applicant: International Business Machines Corporation, Armonk, NY (US)

(72) Inventor: Shidong Li, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,512

(22) Filed: Nov. 15, 2017

(65) Prior Publication Data

US 2018/0061778 A1    Mar. 1, 2018

Related U.S. Application Data

(63) Continuation of application No. 15/453,334, filed on Mar. 8, 2017, which is a continuation of application No. 14/958,307, filed on Dec. 3, 2015, now Pat. No. 9,666,539.

(51) Int. Cl.
| | |
|---|---|
| *H01L 23/34* | (2006.01) |
| *H01L 23/00* | (2006.01) |
| *H01L 21/48* | (2006.01) |
| *H01L 23/498* | (2006.01) |
| *H01L 23/367* | (2006.01) |

(52) U.S. Cl.
CPC ........ *H01L 23/562* (2013.01); *H01L 21/4853* (2013.01); *H01L 21/4857* (2013.01); *H01L 21/4882* (2013.01); *H01L 23/3675* (2013.01); *H01L 23/49822* (2013.01); *H01L 23/49838* (2013.01); *H01L 24/16* (2013.01); *H01L 2224/16227* (2013.01)

(58) Field of Classification Search
CPC .......... H01L 23/3675; H01L 23/49822; H01L 23/49838; H01L 24/16; H01L 21/4882; H01L 21/4857
USPC ....................................... 257/707
See application file for complete search history.

(56) References Cited

U.S. PATENT DOCUMENTS

| | | |
|---|---|---|
| 7,956,450 B2 | 6/2011 | Park |
| 8,916,958 B2 | 12/2014 | Tong et al. |
| 9,165,877 B2 | 10/2015 | Chen et al. |
| 9,666,539 B1 | 5/2017 | Li |
| 2017/0179047 A1 | 6/2017 | Li |

OTHER PUBLICATIONS

IBM "List of IBM Patents or Patent Applications Treated As Related (Appendix P)"; Filed Mar. 26, 2018, 2 pages.

*Primary Examiner* — Luan C Thai

(74) *Attorney, Agent, or Firm* — Cantor Colburn LLP; Jennifer Anda

(57) ABSTRACT

Disclosed are chip packaging structures for high speed chip to chip and chip to carrier communications and methods of making such structures. The chip packaging structures do not require an interposer containing through silicon vias and/or provide structures having reduced warping.

1 Claim, 4 Drawing Sheets

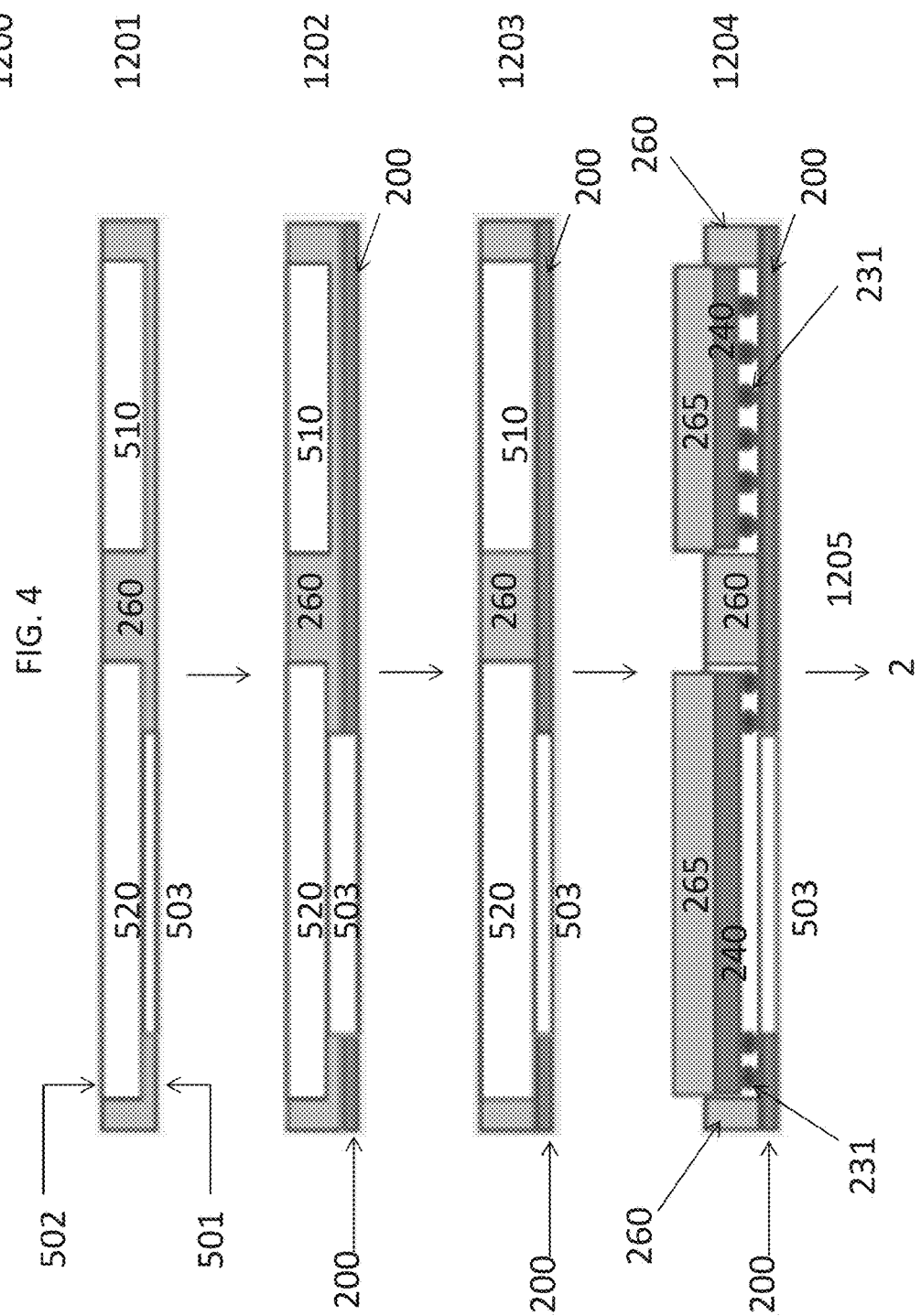

PACKAGING FOR HIGH SPEED CHIP TO CHIP COMMUNICATION

DOMESTIC PRIORITY

This application is a continuation of co-pending U.S. patent application Ser. No. 15/453,334, filed Mar. 8, 2017, which claims priority to U.S. application Ser. No. 14/958,307, filed Dec. 3, 2015, now issued as U.S. Pat. No. 9,666,539, the disclosures of which are incorporated by reference herein in its entirety.

BACKGROUND

The present invention generally relates to chip packaging structures for high speed chip to chip communication and methods of making the structures; and more specifically to chip packaging structures and methods that do not require an interposer containing through vias and/or exhibit reduced warping.

In the electronic packaging field, there is a drive to develop thinner and larger structures. In 3D chip stacks, chips or dice are layered on top of one another in a three-dimensional stack with electrical interconnects between layers. This configuration has many benefits, such as providing a designer with the ability to place an increased number of chips in a given two-dimensional area with an increased amount of electrical communications between them. In 2.5D packages, an interconnect substrate known as an interposer is used to provide high density interconnects. The interposer is placed between the substrate and the dice, where the interposer contains through silicon vias (TSVs) connecting the metallization layers on its upper and lower surfaces.

One of the main challenges encountered in the development of interposer technology is the process of front-to-back contacts in the interposer. The state of art for front-to-back contacts is to fabricate vertical electrical connections (vias) in the interposer. A typical process is first to drill through holes in the interposer base material, say silicon, then backfill the holes with metal, e.g. copper. The hole drilling process adds significant cost to the product, which is even more challenging for non-silicon material such as glass. Thus, the cost of a large interposer is significant. Through holes drilling and through vias fabrication remain technical challenges for interposers other than silicon, as well as for thick silicon interposers.

In addition, there are further challenges with the 3D and 2.5D chip packages, including adequately controlling heat dissipation and minimizing warping due to the mismatch in mechanical properties of the various layers of the structures made from materials having different coefficients of thermal expansion (CTE). Thin, large interposers often have issues with warpage and assembly.

Flip-chip technology includes methods for interconnecting semiconductor devices, such as integrated circuit (IC) chips to external circuitry using solder bumps that have been deposited onto chip pads. The solder bumps are deposited on the chip pads on a top side of a wafer to mount the chip to external circuitry (e.g., a circuit board or another chip or wafer). The wafer is flipped over so that its top side faces down, and aligned so that its pads align with matching pads on the external circuit, and then the solder is flowed to complete the interconnect. This technique is in contrast to wire bonding, in which the chip is mounted upright, and wires are used to interconnect the chip pads to external circuitry.

There remains a need in the art for the development of new chip package designs that are more cost effective and which provide structural stability to the overall package and adequate communication capabilities between chips and between chips and the chip carrier.

SUMMARY

In one embodiment, a method comprises forming a wiring layer on at least a portion of an interior surface of a back plate; forming a first plurality and a second plurality of interconnects on the surface of the wiring layer; electrically connecting a plurality of chips to the wiring layer through the first plurality of interconnects; electrically connecting a chip carrier to the wiring layer through the second plurality of interconnects; optionally electrically connecting one or more of the plurality of chips to the chip carrier through a third plurality of interconnects; and optionally applying underfill in a space between the metallic laminate, the plurality of chips, and the chip carrier.

In another embodiment, a method comprises providing a lid comprising a back side, a front side, and a plurality of lid recesses; forming a wiring layer on at least a portion of the front side of the lid; removing a portion of the lid to expose the wiring layer to the back side of the lid; providing a plurality of chips, wherein each chip comprises a chip lid mechanically connected to a back side of the chip; electrically connecting the plurality of chips to the wiring layer by placing a chip in a lid recess from the back side of the lid, wherein the connecting is made through a first plurality of interconnects; electrically connecting a chip carrier to the wiring layer through a second plurality of interconnects; optionally electrically connecting one or more chips of the plurality of chips to the chip carrier through a third plurality of interconnects; and optionally applying underfill in a space between the metallic laminate, the plurality of chips, and the chip carrier.

In another embodiment, a chip package system comprises a single sided core laminate comprising a back plate and a wiring layer in contact with an interior of the back plate; a chip in electrical connection with the wiring layer; a chip carrier sandwiching the chip between the wiring layer and the chip carrier; and at least one interconnect electrically connecting the wiring layer with the chip carrier, wherein the wiring layer enables high speed chip to chip communication and chip to chip carrier communication.

In yet another embodiment, chip package system comprises a lid comprising a plurality of lid recesses wherein each lid recess accommodates a chip; a wiring layer in contact with an interior of the lid; a chip in electrical connection with the wiring layer, the chip comprising a chip lid mechanically attached to a back side of the chip, and the chip is located in a lid recess; a chip carrier in electrical connection with the wiring layer such that at least a portion of the wiring layer is between the chip and the chip carrier; and at least one interconnect electrically connecting the wiring layer with the chip carrier, wherein the wiring layer is a dielectric that enables high speed chip to chip communication and chip to chip carrier communication.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 illustrates an exemplary method for creating a chip package according to an embodiment of the invention.

DETAILED DESCRIPTION

Figure 1:
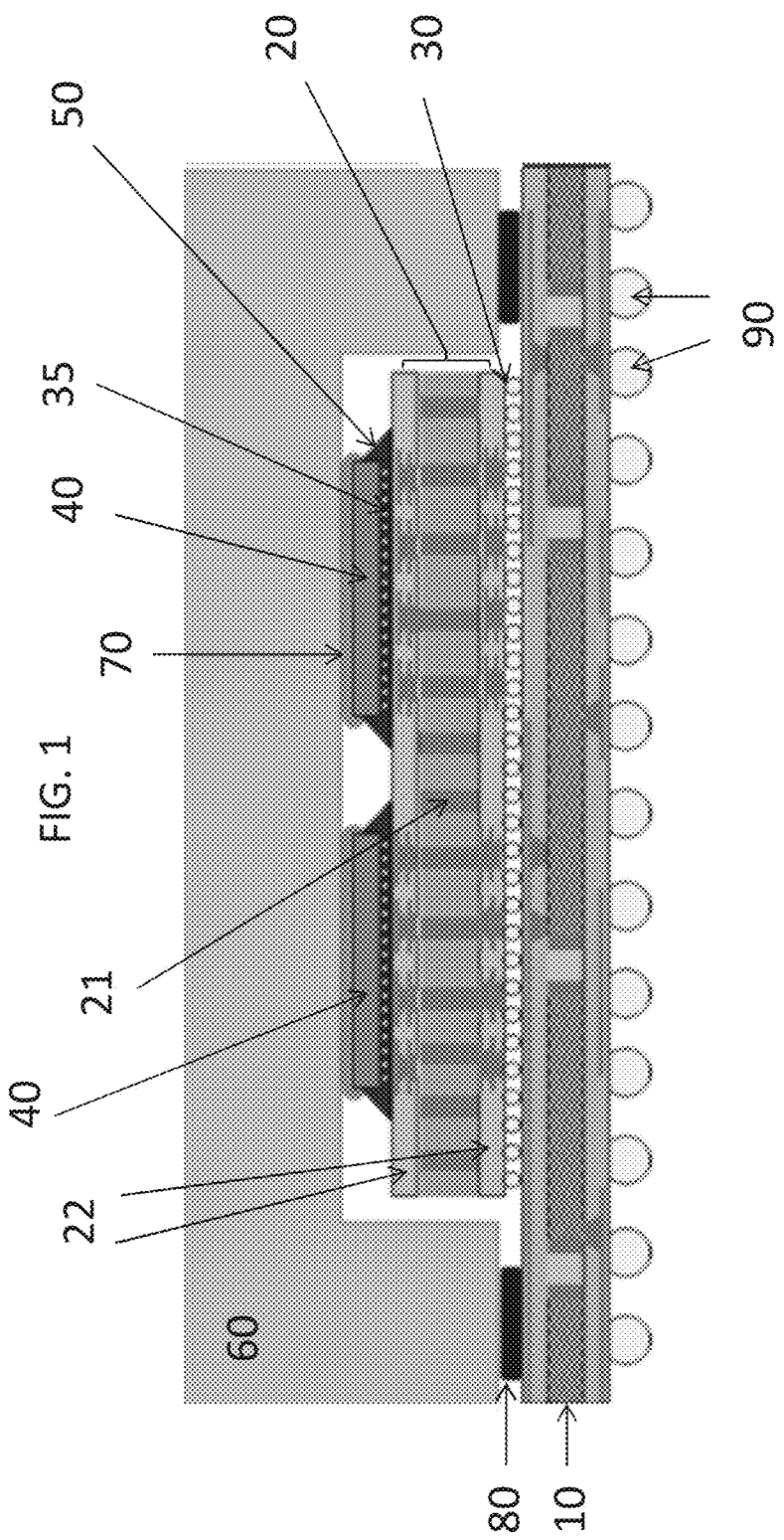
FIG. 1 is a cross-sectional view of a conventional chip package containing an interposer.

As stated above, the present invention relates to chip packaging structures for high speed chip to chip communication and chip to carrier communication, and methods of making these structures. It has been found that by joining a chip-metallic laminate-lid deck to a chip carrier from the chip side, expensive through vias are not necessary to achieve adequate chip to carrier communication. In these embodiments, the chip packaging structure does not require an interposer containing through silicon vias. The metallic laminate itself enables high speed chip to chip communication as well as communication between the chips and the carrier.

In a first embodiment, a chip package system comprises a single sided metal core laminate comprising a metal back plate, whose interior surface (alternatively referred to as the front side) is attached to a thin layer of electrically insulated but thermally conductive material, e.g., a ceramic or polymer, on which one or more layers of circuits (alternatively referred to as a wiring layer) are fabricated; a plurality of chips in electrical connection with the wiring layer; a chip carrier sandwiching the plurality of chips between the wiring layer and the chip carrier; and at least one interconnect electrically connecting the wiring layer with the chip carrier, wherein the single sided metal core laminate enables high speed chip to chip communication and chip to chip carrier communication. In an alternative embodiment, the chip package system comprises a single sided core laminate comprising a back plate made from a non-metallic yet thermally conductive material.

In a second embodiment, a chip package system comprises a lid comprising a plurality of lid recesses wherein each lid recess accommodates a chip; a wiring layer in contact with an interior of the lid (alternatively referred to as the front side of the lid); a plurality of chips in electrical connection with the wiring layer, each chip comprising a chip lid mechanically attached to a back of the chip, and each chip located in a lid recess; a chip carrier in electrical connection with the wiring layer such that at least a portion of the wiring layer is between the plurality of chips and the chip carrier; and at least one interconnect electrically connecting the wiring layer with the chip carrier, wherein the wiring layer enables high speed chip to chip communication and chip to chip carrier communication.

Circuits embedded in organic thin film layer can be described as a "wiring layer". It is one or more layers of circuit/dielectric material layers provided to enable high speed chip to chip communication and signal outspread to the chip carrier.

The wiring layer is located on an interior/front side of a lid component. The lid provides both mechanical stiffness to the package and protection of the chips, yet also functions to dissipate the heat from the chip package during use. The lid may be made of metal or other high thermal conductivity material that provides good thermal performance. In an embodiment, the lid is made of metal, specifically copper sheet.

The chip carrier can be an organic laminate structure or some other suitable chip carrier structure.

A variety of interconnects can be used to electrically connect the chips to the metallic laminate or wiring layer, the metallic laminate or wiring layer to the chip carrier, the chip carrier to the next level of assembly, and in certain embodiments, the chip to the chip carrier. Suitable interconnect technology includes wire-bond, flip-chip solder bump, ball grid array (BGA), land grid array (LGA), pin grid array, metallic tall pillar interconnects, etc., and the like.

In an embodiment, interconnects between the chips and the metallic laminate or wiring layer are solder bumps or microbumps.

In an embodiment, interconnects between the metallic laminate or wiring layer and the chip carrier are solder bumps or microbumps, tall pillar interconnects, or a combination thereof.

In an embodiment, interconnects between the chips and the chip carrier can be tall pillar interconnects, such as tall metallic pillar interconnects made from copper. In an embodiment, interconnects between the chips and the chip carrier are solder bumps or microbumps.

Chip packaging structures and methods of making the invention are now described in detail with accompanying figures Like reference numerals refer to like elements across different embodiments. The figures are not to scale. A conventional chip package is also described.

FIG. 1 is a cross-sectional view of a conventional chip package containing an interposer region that allows for high density interconnects among a group of chips or dice present in the package. A chip carrier (10), for example an organic laminate substrate, functions to spread signals received from the interposer to external devices (not shown). An interposer (20) is electrically connected to the chip carrier (10) through C4 bumps (30). The interposer (20) allows for high density interconnects and high speed signal transmission among multiple chips (40), which are electrically connected to the interposer (20). The interposer (20) contains multiple through silicon vias (TSV, (21)) and two redistribution layers (RDL, (22)). In FIG. 1, the electrical connection is by way of C4 microbumps (35), and an underfill material (50) is present to fill in the gaps between the chip (40) and C4 microbumps (35). Between the chip (40) and the lid (60) is a thermal interface material (70) which functions to dissipate heat from the chip (40). The lid (60) is mainly a mechanical component to protect the components in the interior of the package and to control warpage of the package. The lid (60) can also function as a heat dissipation channel between the chips (40) and a heat sink (not shown). The lid (60) is mechanically connected to the chip carrier (10) by a lid adhesive (80). In FIG. 1, BGA solder balls (90) are shown.

Figure 2:
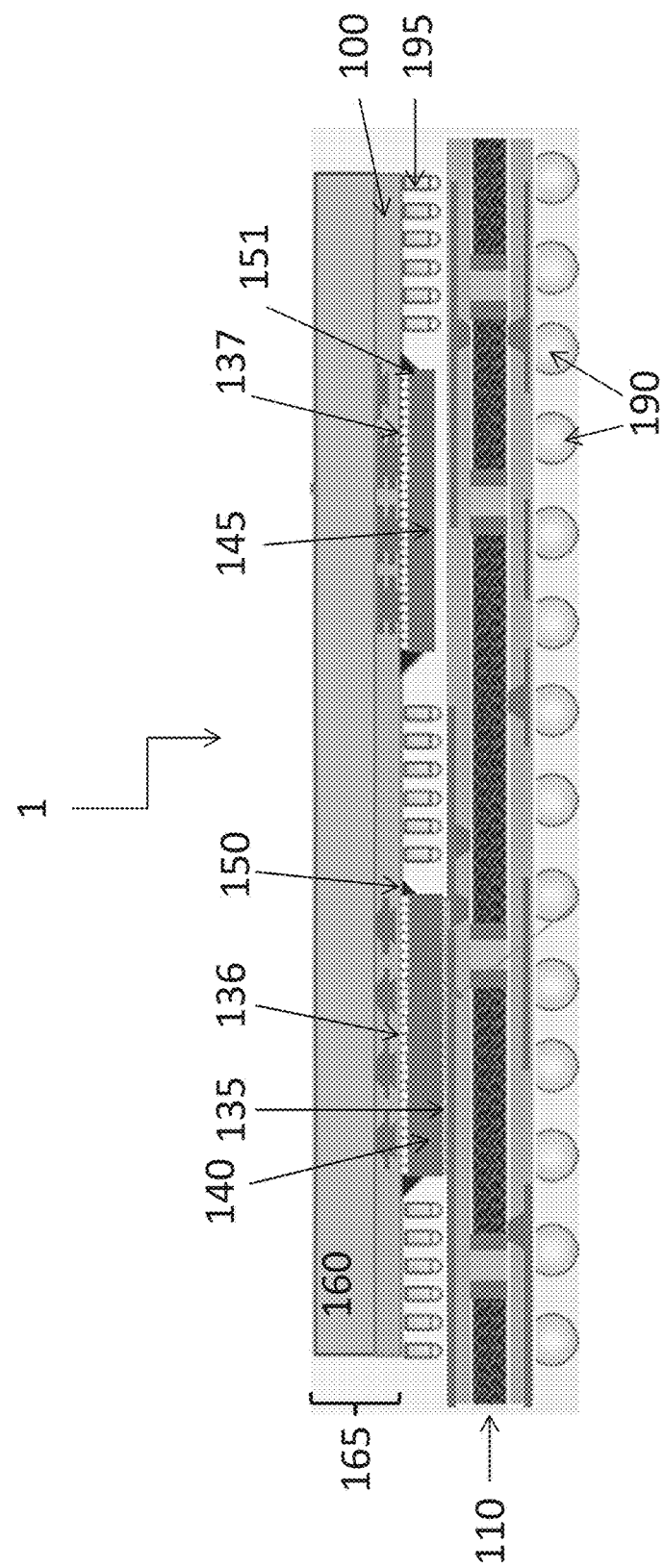
FIG. 2 is a cross-sectional view of a chip package comprising multiple chips sandwiched between a chip carrier and a single sided metal core laminate.

FIG. 2 is a cross-sectional view of a chip package (1) according to a first embodiment where there is no need for an interposer containing TSV. This first embodiment has a structure comprising multiple chips (140, 145) sandwiched by one chip carrier (110) and a single sided metal core laminate (165) including a metal back plate (160) upon which a wiring layer (100) is located to enable high speed chip to chip communication and signal outspread. A thin layer of electrically insulated but thermally conductive material can be located between the metal back plate (160) and the wiring layer (100). The wiring layer (100) can cover a portion of or the entire metal back plate (160) interior area. The chip carrier (110), for example an organic laminate substrate, functions to spread signals received from the wiring layer (100) to external devices (not shown). In FIG. 2, a high power module chip (140) is electrically connected to the chip carrier (110) by interconnects, in this example by the use of C4 microbumps (135). The high power module chip (140) is in turn electrically connected to the wiring layer (100) through C4 microbumps (136). The wiring layer (100) of the single sided metal core laminate (165) enables communication between the high power module chip (140), the low power module chip (145), and other chips (not shown). By reversing the chip join and using single sided metal core laminate (165) having the wiring layer (100), there is no need for an interposer with TSV. In the embodiment of FIG. 2, an underfill material (150) is present to fill in the gaps between the high power module chip (140) and C4 microbumps (136) connecting to the wiring layer (100). The wiring layer (100) is in turn joined to the metal back plate (160), which is made from metal or other high thermal conductivity material. The metal back plate (160) can be as stiff and thick as needed. The chip package of FIG. 2 includes a low power module chip (145) electrically connected to the wiring layer (100) through C4 microbumps (137). An underfill material (151) is present to fill in the gaps between the low power module chip (145) and C4 microbumps (137) connecting to the wiring layer (100). The wiring layer (100) of the single sided metal core laminate (165) can further be electrically connected to the chip carrier (110) through interconnects, e.g. by the use of tall pillar C4 connections (195). In FIG. 2, BGA solder balls (190) are shown although other surface mount technology can be used, such as LGA, and the like. For high power applications, the power supply can be through TSV or wire bonding from the back side. For low power applications, there will be no need for TSV as the power can be provided through the peripheral. In an embodiment, the back side of the low power module chip can be bonded to the chip carrier with an adhesive. Although FIG. 2 exemplifies an embodiment containing both a high power module chip and a low power module chip, the chip package in general is not limited to this pattern, but may contain all high power module chips, low power module chips, and any combination of the two.

In the embodiment of FIG. 2, the chips can be thinned if needed prior to being joined to the single sided metal core laminate (165) with interconnects. In one embodiment, one or more chips can be thinned to about 50 to about 100 micrometers, specifically about 50 to about 75 micrometers.

In an exemplary method for creating a chip package according to the first embodiment, the method begins with the formation of an insulation layer on a metal back plate layer. The metal back plate layer can be a metal plate such as copper, another metal, or other thermally conductive material. The insulation layer can be polymer or ceramic which may be deposited directly on the metal back plate. A wiring layer is then formed over the surface of the insulation layer to form the single sided metal core laminate. The wiring layer can be fabricated through organic multilayer processes, or a combination of organic multilayer processes and semiconductor thin-film processes. A plurality of microbump pads is formed on the surface of the wiring layer. The microbump pads can be made from copper. A plurality of tall metallic interconnects, such as copper pillars, can be formed on the surface of the wiring layer in different locations than the microbump pads. These tall metallic interconnects can be of a height suitable to effect an electrical connection between the wiring layer and the chip carrier. An exemplary height can be 50 micrometers or greater, specifically about 50 micrometers to about 70 micrometers. A film mask alignment process is conducted to prepare the structure for microbump formation. In this step a masking material is formed to cover the surface of the wiring layer and microbump pads. The masking material located over the microbump pads is then removed to expose the microbump pads. Standard lithography techniques for metallization of pads can be used. Microbumps are then formed on the exposed microbump pads. This step can be conducted by injection of molten solder followed by solder solidification. The masking material is removed and a second film mask alignment step is conducted in a process to create the tall metallic interconnect microbump formation. The second film mask alignment step and masking material can be similar to first film mask alignment step. Molten solder is injected on the exposed surfaces of the tall metallic interconnects and the solder is allowed to solidify to form the tall metallic interconnect microbumps. The masking material is removed to result in a single sided metal core laminate and interconnect structure comprising a plurality of microbumps and a plurality of tall metallic interconnects having microbumps at the terminal ends. In a subsequent step, multiple chips are joined to the single sided metal core laminate and interconnect structure using the microbumps to form a solder bond. The result is a single sided metal core laminate-chip structure comprising a plurality of chips. In an optional step, an underfill material can be applied in and around the microbumps of the solder bond. The tall metallic interconnect microbumps can then be planarized. Fly-cutting or other similar process may be used for the planarization step. The single sided metal core laminate-chip structure with planarized tall metallic interconnect microbumps is then joined to a chip carrier to form the chip package. In an optional step, an underfill material is applied between the metallic laminate layer and the chip carrier, to fill in and around the chips and tall metallic interconnects. In an optional embodiment, one or more chips can further contain metallic interconnects, such as microbumps, on the back side of the chip, which can be used to electrically connect the chips to the chip carrier. This embodiment would include, for example, the high power modulus chip (140) of FIG. 2.

In a second embodiment, the chip package has a structure comprising multiple chips, a chip carrier, and a lid upon which a wiring layer is located to enable high speed chip to chip communication and signal outspread. The wiring layer can cover a portion of or the entire lid interior area. In the second embodiment, the lid comprises a plurality of recesses, each of which is slightly larger than the chip that it will house. Each chip contains a chip lid mechanically connected to the back side of the chip. The chips are placed in the recesses of the recessed lid such that the lid and chip lids form an overall composite lid. An electrical connection between the chips and the wiring layer can be realized using microbumps, wire bonds and/or other method of connection as discussed above. Optionally, cushions layers can be placed between the chip and the chip lid to accommodate the tolerance or gap. The recessed lid with the chips is then joined to a chip carrier using flip-chip C4 technology or other suitable interconnect methods.

Figure 3:
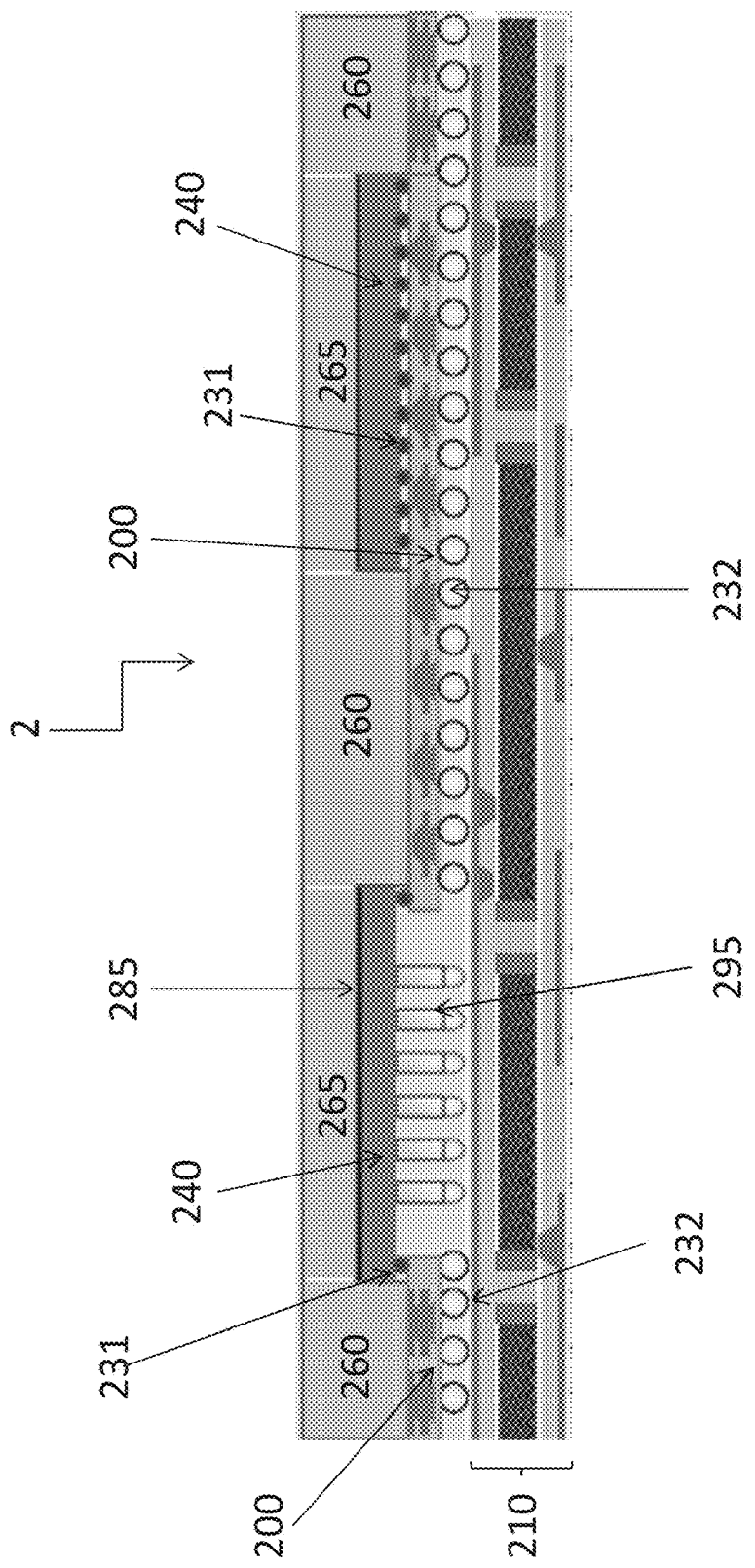
FIG. 3 is a cross-sectional view of a chip package comprising multiple chips sandwiched between a chip carrier and a composite lid with wiring layers located between the chips and the chip carrier.

FIG. 3 is a cross-sectional view of a chip package (2) according to the second embodiment of the invention where again there is no need for an interposer. FIG. 3 has a structure comprising multiple chips (240) sandwiched by one chip carrier (210) and one composite lid (combination of lid 260 and chip lid 265) upon which the wiring layer (200) is located. The chip carrier (210) can be, for example, an organic laminate. The composite lid (combination of lid 260 and chip lid 265) can be made of, for example, metal or other high thermal conductivity material. The composite lid is prepared from lid (260) comprising a plurality of recesses each capable of accommodating a chip (240)-chip lid (265) structure with an optional cushion layer (285) used to accommodate the tolerance or gap. The chips (240) are joined to the wiring layer (200) using interconnects such as a solder join using microbumps (231). The chip carrier (210) is joined to the wiring layer (200) through microbumps (232). The chip carrier (210) can also be joined to one or more chips (240) through tall pillar interconnects (295). The metallic laminate (200) can cover a portion or the entire area of the lid interior (260). The chip carrier (210) functions to spread signals received from the wiring layer (200) to external devices (not shown). The chip package (2) can be mounted to a mother board or other next level of assembly using a surface mount technology such as BGA, LGA, or the like (not shown in FIG. 3).

FIG. 4 shows an exemplary method (1200) for creating a chip package (2) according to the second embodiment. The method begins with step (1201), providing a lid (260) having a front side (interior) (501) and a back side (502). The lid (260) comprises a plurality of recesses (510 and 520) on the back side (502). Some recesses (520) have an opening that extends entirely through the front side (501) and the back side (502) to create an opening or hole (503) in the lid (260) that is smaller in area than the recess (520). The lid (260) can be made from a metal such as copper, another metal, or other thermally conductive material. In step (1202) an insulation layer (not shown) is formed on a surface of the front side (501) of the lid (260) followed by the formation of a wiring layer (200) over the surface of the insulation layer. The insulation layer can be a polymer or ceramic which may be deposited directly on the lid layer (260). In a subsequent step (1203), any unnecessary lid material is etched away from the recesses (510) and (520) from the back side (502) to expose regions of the wiring layer (200) to the back side (502). In a separate step (not shown in FIG. 4), a chip (240) is mechanically attached, for example by the use of an adhesive, to a solid block of material that functions as the chip lid (265). A chip (240)-chip lid (265) structure is placed in each of the recesses (510) and (520) of the lid (260) in step (1204) such that the chip lid (265) forms a composite lid with lid (260). In step (1204) each chip (240) is joined to the wiring layer (200) using interconnects such as a solder join using microbumps (231) to form a lid-chip-wiring layer structure. In step (1205) the lid-chip-wiring layer structure is joined with a chip carrier (210) to form a chip package substantially similar to chip package (2) of FIG. 3. The join can be made using interconnects such as microbumps (232) and/or tall pillar interconnects (295).

In an embodiment, a chip package system comprises a single sided core laminate comprising a back plate and a wiring layer in contact with an interior of the back plate; a chip in electrical connection with the wiring layer; a chip carrier sandwiching the chip between the wiring layer and the chip carrier; and at least one interconnect electrically connecting the wiring layer with the chip carrier, wherein the wiring layer is a dielectric that enables high speed chip to chip communication and chip to chip carrier communication. It is understood that the chip package can contain any number of chips. Within this embodiment, the chip is in electrical connection with the chip carrier through at least one interconnect; the at least one interconnect electrically connecting the wiring layer with the chip carrier of the structure is a tall pillar interconnect; the chip in electrical connection with the wiring layer of the structure is connected through microbumps; the chip of the structure is in electrical connection with the chip carrier through microbumps; or a combination thereof. Also within this embodiment, the chip package system can comprise at least one high power module chip, at least one low power module chip, or a combination thereof. The at least one low power module chip can be powered through a peripheral; and optionally the at least one low power module chip can be bonded to the chip carrier using an adhesive. The at least one high power module chip can be powered through a via or wire bonding. In an embodiment, the single sided core laminate comprising a back plate and a wiring layer in contact with an interior of the back plate is a single sided metal core laminate comprising a metal back plate and a wiring layer in contact with an interior of the metal back plate.

In another embodiment, a chip package system comprises a lid comprising a plurality of lid recesses wherein each lid recess accommodates a chip; a wiring layer in contact with an interior of the lid; a chip in electrical connection with the wiring layer, the chip comprising a chip lid mechanically attached to a back side of the chip, and the chip is located in a lid recess; a chip carrier in electrical connection with the wiring layer such that at least a portion of the wiring layer is between the chip and the chip carrier; and at least one interconnect electrically connecting the wiring layer with the chip carrier, wherein the wiring layer is a dielectric that enables high speed chip to chip communication and chip to chip carrier communication. It is understood that the chip package can contain any number of chips. Within this embodiment, the chip is in electrical connection with the chip carrier through at least one interconnect; the at least one interconnect electrically connecting the wiring layer with the chip carrier is a microbump; the chip in electrical connection with the wiring layer is connected through microbumps; the chip is in electrical connection with the chip carrier through tall pillar interconnects; or a combination thereof. Also within this embodiment, the chip package system can comprise at least one high power module chip, at least one low power module chip, or a combination thereof. The at least one low power module chip can be powered through a peripheral; and optionally the at least one low power module chip can be bonded to the chip carrier using an adhesive. The at least one high power module chip can be powered through a via or wire bonding.

The chip package structures according to the invention have many advantages, including reduced cost as compared to the expensive through vias manufacturing, particularly for large interposers. For low power applications, there is no need for through vias. For high power applications, through vias can be used for power if power cannot be supply through alternative ways such as wire bonding. The structures of the invention avoid the need to join chips to a large and highly flexible interposer. For example, the lid of the packages can be made from a metal substrate and thus can be as stiff as needed, thereby minimizing warpage of the overall package. Good flatness for second level packages can be achieved as the chips are sandwiched by the lid and chip carrier whose CTE are both high.

Those skilled in the art will appreciate that the exemplary chip package structures discussed above can be distributed in raw form or incorporated as parts of intermediate products or end products. For example, the chip packages can be electrically connected to the next level of assembly, such as a mother board, using interconnects such as BGA, LGA, pin grid array, etc., and the like.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip package system, comprising:
   a metal lid comprising a recess;
   a wiring layer in contact with a surface of the metal lid, the wiring layer enabling high speed chip-to-chip communication and chip-to-chip carrier communication;
   a chip positioned in the recess such that a first side of the chip is in contact with a surface of the recess;
   a chip carrier sandwiching the chip between the metal lid and the chip carrier;
   at least one first interconnect electrically connecting the wiring layer to a second side of the chip, the at least one first interconnect comprising a microbump;
   at least one second interconnect electrically connecting the second side of the chip to the chip carrier, the at least one second interconnect comprising a tall pillar interconnect; and
   at least one third interconnect electrically connecting the wiring layer to the chip carrier, the at least one third interconnect comprising a microbump.

* * * * *